(12) United States Patent
Chen et al.

(10) Patent No.: US 10,067,303 B1
(45) Date of Patent: Sep. 4, 2018

(54) OPTICAL GRATING

(71) Applicant: FINISAR CORPORATION, Sunnyvale, CA (US)

(72) Inventors: Jianxiao Chen, Fremont, CA (US); Xiaojie Xu, Pleasanton, CA (US); Bernd Huebner, Mountain View, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 15/408,352

(22) Filed: Jan. 17, 2017

Related U.S. Application Data

(60) Provisional application No. 62/278,572, filed on Jan. 14, 2016.

(51) Int. Cl.
*G02B 6/42* (2006.01)
*G02B 6/34* (2006.01)

(52) U.S. Cl.
CPC ............ *G02B 6/4206* (2013.01); *G02B 6/34* (2013.01); *G02B 6/4218* (2013.01)

(58) Field of Classification Search
None
See application file for complete search history.

(56) References Cited

U.S. PATENT DOCUMENTS 9,632,248 B2 * 4/2017 Selvaraja .............. G02B 6/124
9,703,043 B2 * 7/2017 Chen .................. G02B 6/29328

\* cited by examiner

*Primary Examiner* — Jerry Rahll
(74) *Attorney, Agent, or Firm* — Maschoff Brennan (57) ABSTRACT

A transceiver system may include a laser and a silicon optical grating. The laser may be configured to emit a laser beam at an output of the laser. The laser beam may have a non-circular elliptical mode profile. The silicon grating may be configured to exhibit a mode profile having a shape corresponding to the non-circular elliptical mode profile of the laser beam.

18 Claims, 14 Drawing Sheets

OPTICAL GRATING

CROSS-REFERENCE TO RELATED APPLICATIONS

This patent application claims priority to U.S. Provisional Application No. 62/278,572, filed Jan. 14, 2016, which is incorporated herein by reference in its entirety.

FIELD

The embodiments discussed herein are related to optical gratings.

BACKGROUND

Optical transceivers may couple light from a laser to a lightwave circuit. For instance, silicon photonic (SiP) based transceivers may couple the light from a laser to a SiP planar lightwave circuit (PLC). In some instances, grating couplers have been used to couple the laser and the lightwave circuits.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a transceiver system may include a laser and a silicon optical grating. The laser may be configured to emit a laser beam at an output of the laser. The laser beam may have a non-circular elliptical mode profile. The silicon optical grating may be configured to exhibit a mode profile having a shape corresponding to the non-circular elliptical mode profile of the laser beam.

The object and advantages of the embodiments will be realized and achieved at least by the elements, features, and combinations particularly pointed out in the claims.

The foregoing general description and the following detailed description are exemplary and explanatory and are not restrictive of the claims.

BRIEF DESCRIPTION OF THE DRAWINGS

Example embodiments will be described and explained with additional specificity and detail through the use of the accompanying drawings.

DESCRIPTION

Optical grating couplers may couple the light from a laser to a lightwave circuit, an optical fiber, or the like. By way of example, optical grating couplers may be employed to couple a laser and a silicon photonic (SiP) planar lightwave circuit (PLC). The optical grating couplers may redirect light produced by the laser to a particular location. In some instances, the optical grating couplers may be a relatively low cost and/or a relatively matured technique for achieving the coupling.

Conventional optical grating couplers may exhibit a circular fiber mode profile. A laser beam produced by a particular laser may exhibit a non-circular elliptical mode profile. The differently-shaped mode profiles may result in a relatively large coupling loss, as the laser beam mode profile may not be matched to the existing optical grating coupler mode profile.

As used herein, "ellipse" is intended to describe a non-circular ellipse and "elliptical" is intended to describe a non-circular elliptical shape.

Some embodiments include a silicon optical grating coupler having an optical grating wider than a conventional optical grating. Widening the optical grating may cause the silicon optical grating coupler to exhibit a more elongated elliptical mode profile, which may better match the mode profile of a laser beam. Relative to conventional optical grating having a circular mode profile, some embodiments including a wider optical grating can improve a coupling by reducing a coupling loss by 0.5 decibels (dB) to several dB, depending on the particular shape of the elliptical mode profile the laser beam produced by the laser.

Reference will now be made to the figures wherein like structures will be provided with like reference designations. The drawings are non-limiting, diagrammatic, and schematic representations of example embodiments, and are not necessarily drawn to scale.

Figures 1, 2:
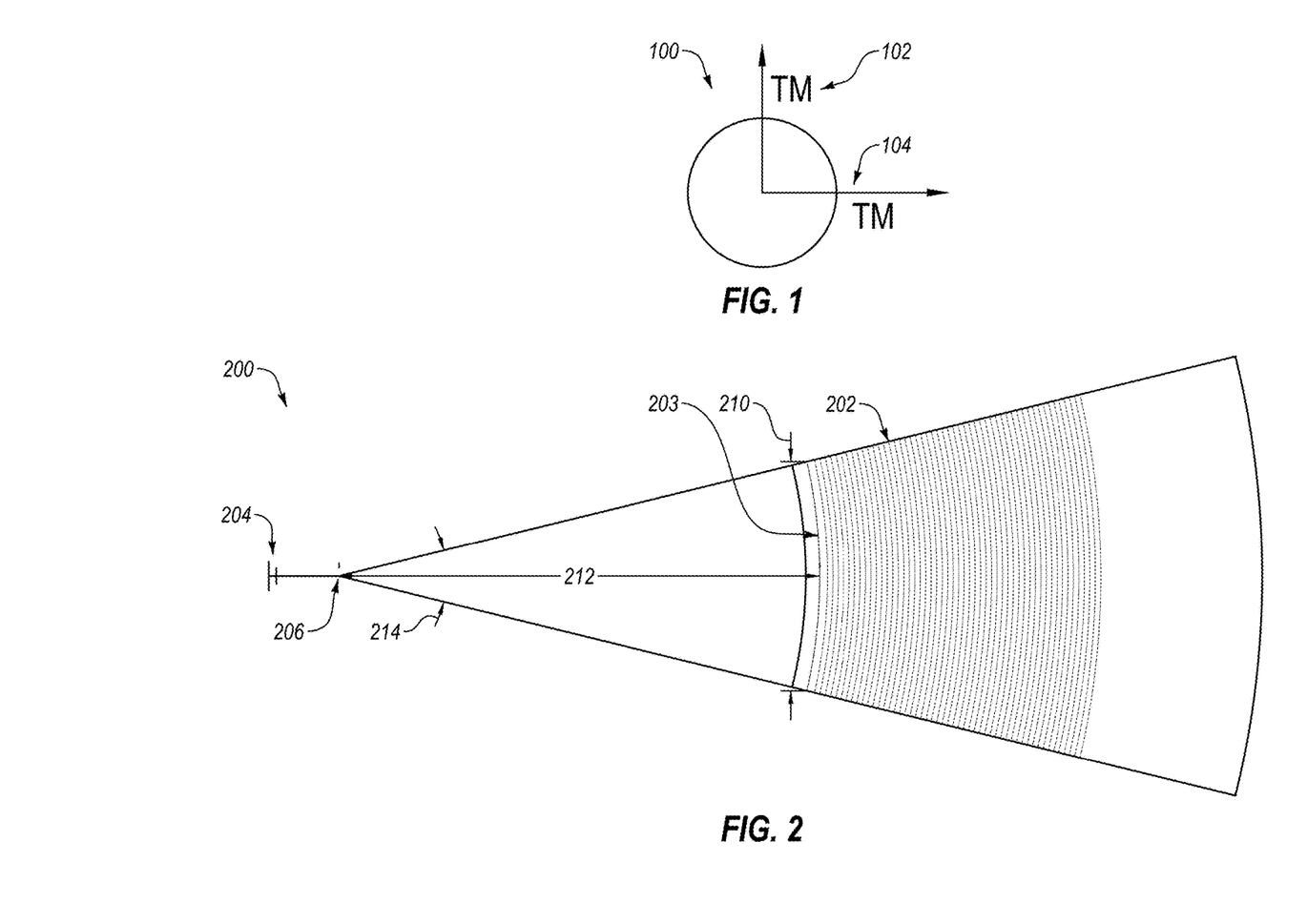
FIG. 1 illustrates a mode profile of a conventional optical grating.
FIG. 2 illustrates a transceiver system including a conventional optical grating.

FIG. 1 illustrates a mode profile 100 of a conventional optical grating. The mode profile 100 is shown with reference to a transverse electric (TE) direction 102 and a transverse magnetic (TM) direction 104. The mode profile 100 of the conventional optical grating is circularly shaped.

FIG. 2 illustrates a transceiver system 200 including a conventional optical grating 202. The transceiver system 200 may include a laser 204 with an output 206, from which the laser may emit a laser beam. An initial width 210 of the optical grating 202 may equal 14.48 micrometers ("microns" or "um"). A distance 212 from the output 206 of the laser 204 to a center of a front surface 203 of the optical grating 202 may equal 30 um. In this and other embodiments, the optical grating 202 and/or the front surface 203 of the optical grating 202 may be curved. In some embodiments, the front surface 203 of the optical grating 202 may be curved such that the length of the front surface 203 is approximately equidistance from the output 206 of the laser 204. Thus, for example, the front surface 203 of the optical grating 202 may have a radius equal to the distance 212. A fan angle 214 may be 28 degrees. The fan angle 214 may be the angle measured from a line drawn from the output 206 to a first side of the optical grating 202 and a line drawn from the output 206 to a second side of the optical grating 202.

The optical grating 202 may receive light generated by the laser 204 and redirect that light to a particular location. For example, the optical grating 202 may receive light generated by the laser 204 and redirect the light in a direction substantially perpendicular to the plane of the optical grating 202. That is, the optical grating 202 may redirect light generated by the laser 204 at least partially in a direction of a z-axis and may redirect light generated by the laser 204 substantially in the direction of the z-axis. Thus, for example, the light generated by the laser 204 may be directed to a PLC or the like.

Figure 3:
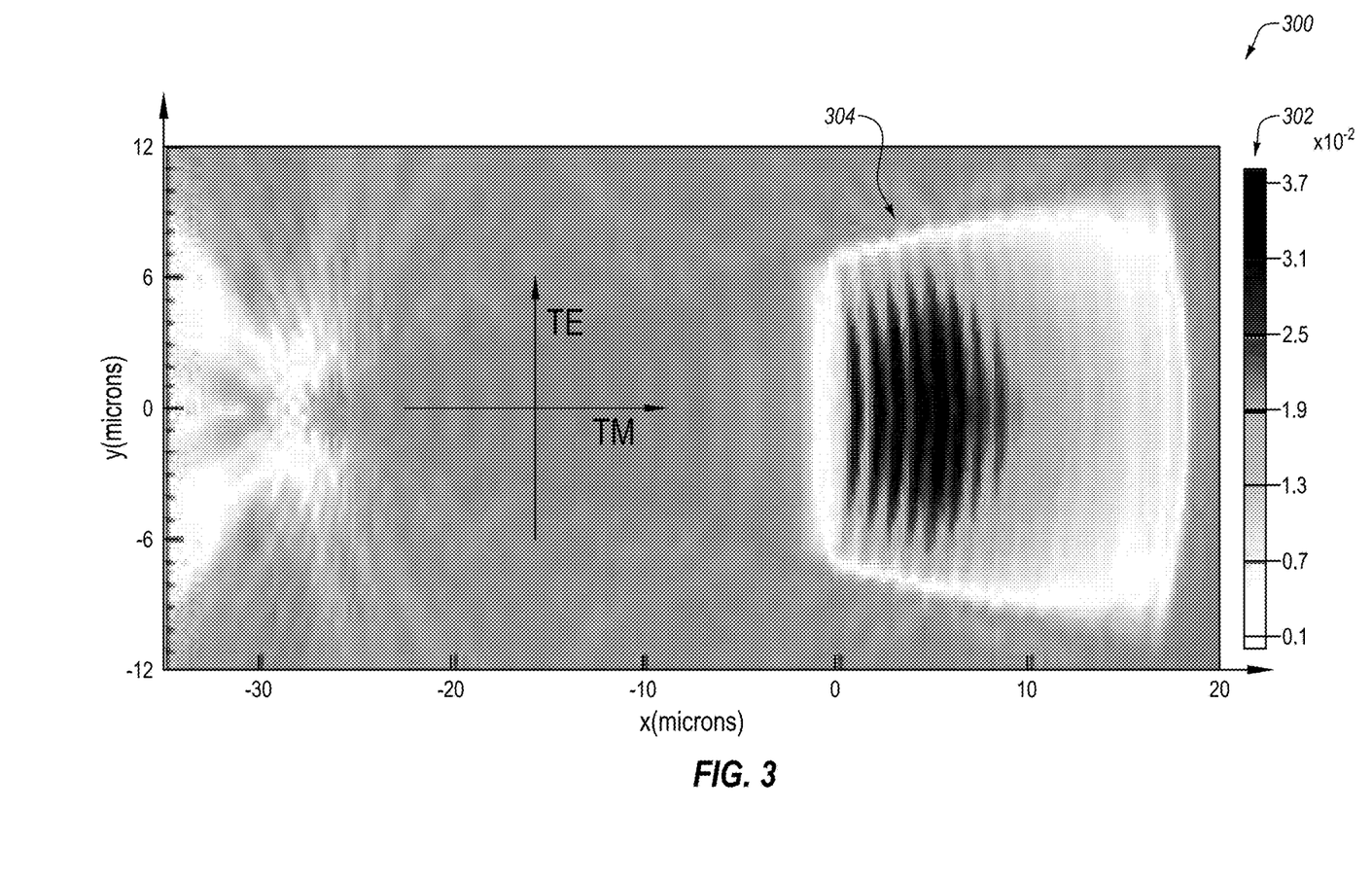
FIG. 3 illustrates an example near field profile of an optical intensity at the transceiver system of FIG. 2.

FIG. 3 illustrates an example near field profile 300 of an optical intensity at the transceiver system 200 of FIG. 2 for a laser beam having a 1310 nanometer (nm) wavelength. The profile 300 includes a scale 302 of the optical intensity values. This and other optical intensity figures herein illustrate the optical intensity in arbitrary units (a.u.).

As indicated in FIG. 3, the y-axis may be associated with the TE direction. The x-axis may be associated with the TM direction. The profile 300 is arranged such that the laser 204 and the output 206 of FIG. 2 are located on the x-axis (e.g., y=0 um) and the front surface 203 of the optical grating 202 of FIG. 2 is located on the y-axis (e.g., x=0 um). Thus, for example, the output 206 may be located at approximately (−30, 0). The optical intensity objects shown near this point (e.g., the left portion of the profile 300) may generally be associated with optical intensities produced by and/or reflected toward the laser 204 of FIG. 2.

A center of the front surface 203 of the optical grating 202 may be located at approximately (0, 0) of the profile 300. The optical intensities observed at the optical grating 202 may be located at the positive-x portion of the profile 300 (e.g., the right portion of the profile 300). An analysis of a mode profile 304 of the optical grating shows that the mode profile 304 has a radius of 6 um in the TM direction (measurement of the radius in the TM direction is indicated herein as Wx) and a radius of 6 um in the TE direction (measurement of the radius in the TE direction is indicated herein as Wy). Thus, for example, the mode profile 304 of the optical grating 202 may be observed as being relatively circular.

Figure 4:
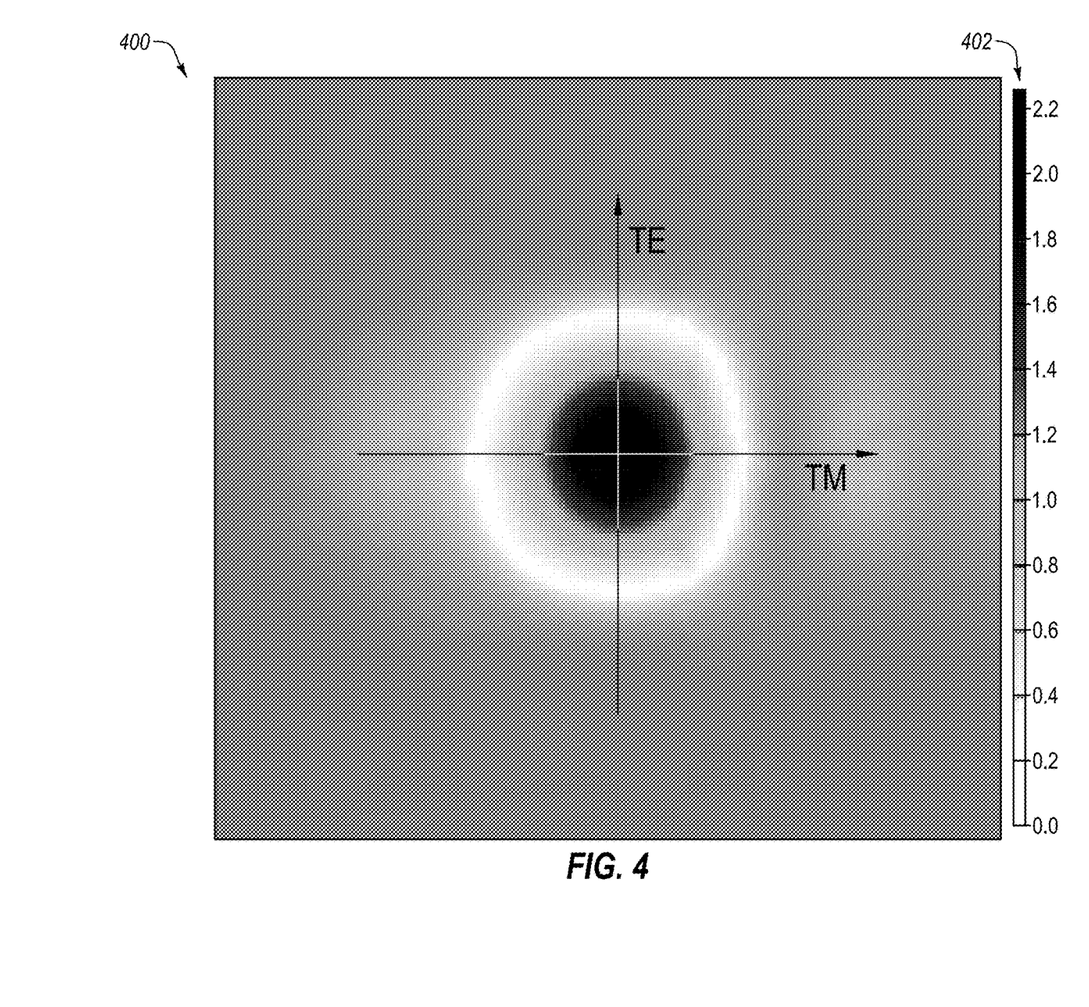
FIG. 4 illustrates a far field mode profile that may result from the transceiver system of FIG. 2.

FIG. 4 illustrates a far field mode profile 400 that may result from the conventional optical grating 202 of FIG. 2. The profile 400 includes a scale 402 of optical intensities in a.u. As may be observed, the far field mode profile 400 has a circular shape.

Figure 5:
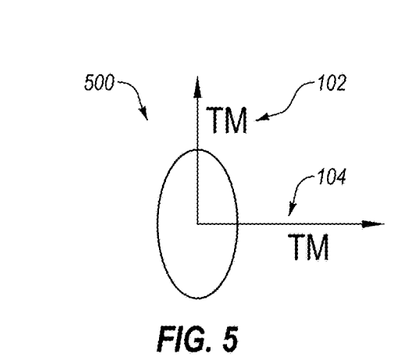
FIG. 5 illustrates a near field mode profile of an example laser beam.

FIG. 5 illustrates a near field mode profile 500 of an example laser beam. The mode profile 500 is shown with reference to the TE direction 102 and the TM direction 104. As may be observed, the mode profile 500 of the laser beam is elliptical. By way of example, the laser 204 of the transceiver system 200 of FIG. 2 may produce a laser beam having a near field mode profile similar to the mode profile 500. A narrower, near field mode size may be associated with a larger, far field divergence angle. Thus, for example, the mode profile 500 may be elliptical with a larger divergence angle in the TM direction and a smaller divergence angle in the TE direction. For this and other embodiments, an ellipticity of a laser mode profile may be defined as the radius of the mode profile in the TM direction divided by the radius of the mode profile in the TE direction. Thus, for example, the mode profile 500 may have an ellipticity of 0.5.

As shown with reference to FIGS. 1-4, conventional optical gratings, such as the optical grating 202 of FIG. 2, exhibit a circular mode profile. The difference in the mode profile of the conventional optical grating and the mode profile 500 of the laser may result in mode mismatch loss.

In some embodiments, example optical grating designs may exhibit emission mode profiles that at least approximately match associated laser mode profiles. Thus, for example, a mode mismatch loss may be reduced and potentially minimized. In some embodiments, a relatively wider optical grating may encourage an optical grating to approximately match a laser mode profile. In some embodiments, an optical grating may be tuned such that the mode profile of the optical grating is elliptically shaped similar to the laser beam mode profile, such as the profile 500.

Some embodiments may include making the optical grating wider than conventional optical grating. Alternately or additionally, the optical grating may be made shorter or longer than conventional optical grating. Alternately or additionally, the optical grating may be made stronger than conventional optical grating by changing an apodization section of the optical grating to uniform optical grating.

Figure 6:
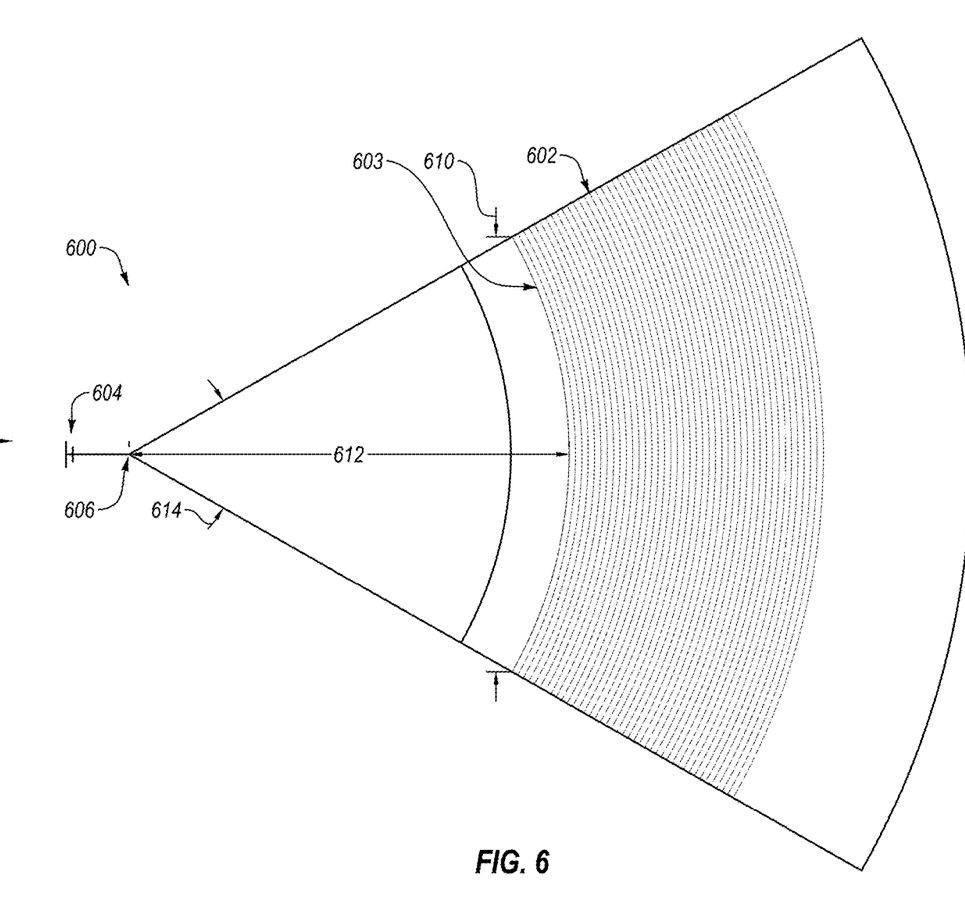
FIG. 6 illustrates another example transceiver system.

FIG. 6 illustrates an example transceiver system 600. The transceiver system 600 includes an optical grating 602 and a laser 604 with an output 606 from which a laser beam may exit. An initial width 610 of the optical grating 602 may be larger than a conventional optical grating, such as the optical grating 202 of FIG. 2. In some embodiments, the optical grating 610 may include a silicon optical grating.

For example, the initial width 610 of the optical grating 602 may be equal to or greater than 15 um. For instance, the initial width 610 of the optical grating 602 may be approximately 20.0 um. The term "approximately" includes anything within 10%, or 5%, or within manufacturing or typical tolerances. In some embodiments, the initial width 610 of the optical grating 602 may be approximately 19 um to 21 um. Alternately, the initial width 610 of the optical grating 602 may be approximately 18 um to 22 um, 17 um to 23 um, or 16 um to 24 um. Alternately, the initial width 610 of the optical grating 602 may be approximately 30 um. Alternately, the initial width 610 of the optical grating 602 may be greater than 20.0 um and less than 30 um. The relatively longer length of the initial width 610 of the optical grating 602 may encourage the optical grating 602 to demonstrate ellipticity.

Figure 7:
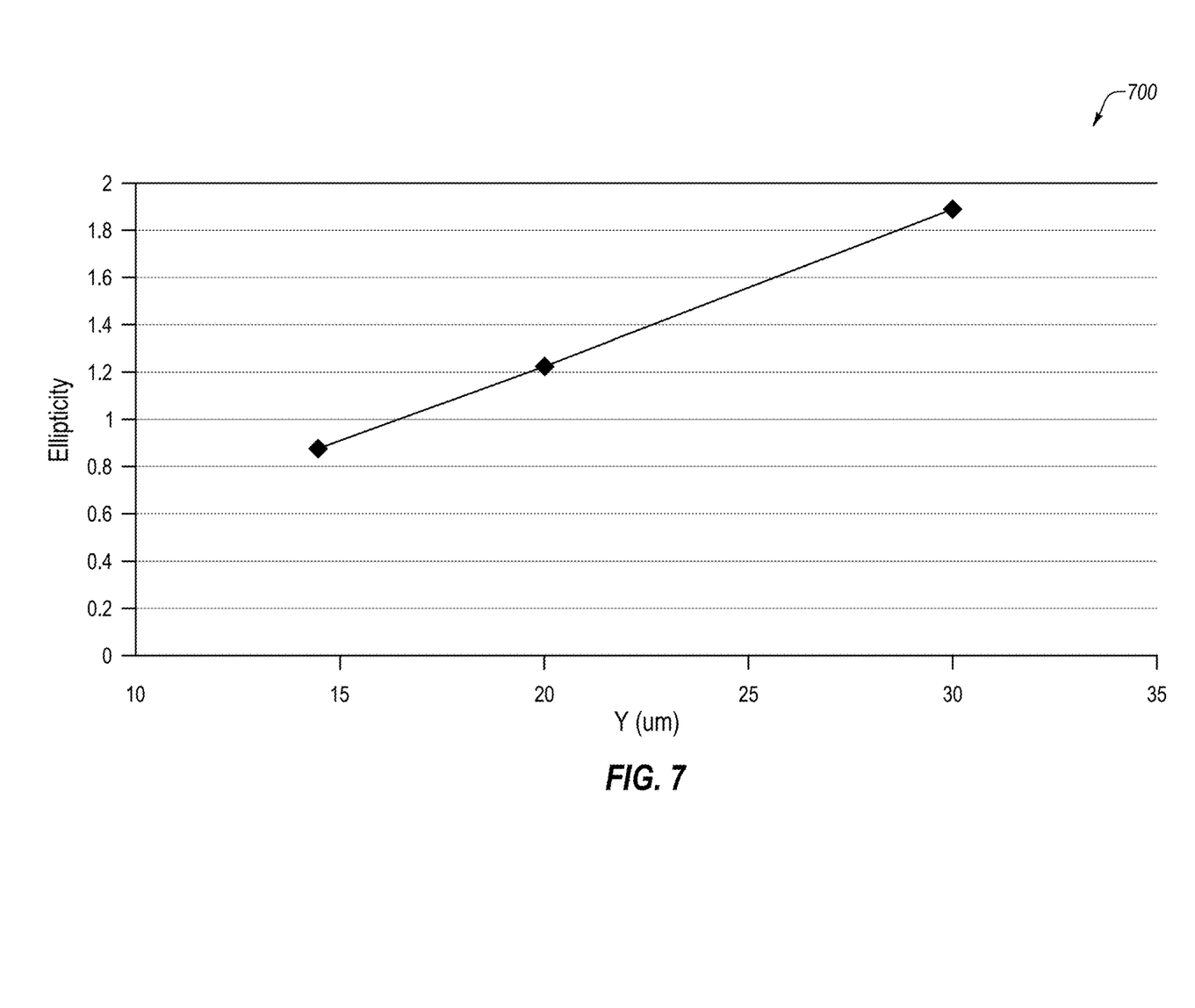
FIG. 7 illustrates an example graph of an ellipticity demonstrated by an optical grating.

FIG. 7 illustrates an example graph 700 of an angle-based ellipticity demonstrated by an optical grating as a function of the width of the optical grating. For example, the graph 700 may represent an angle-based ellipticity of an optical grating such as the optical grating 602 of FIG. 6. Angle-based ellipticity is defined herein as the TM angle divided by the TE angle. Thus, for example, an optical grating width may be selected and employed to substantially match an angle-based ellipticity exhibited by a laser beam produced by a particular laser. For instance, for a laser producing a laser beam having an angle-based ellipticity of 1.22, an optical grating having an initial width of approximately 20.0 um or so may better match the mode profile of the laser than an optical grating having an initial width of 14.48 um. Alternatively, for a laser producing a laser beam having an angle-based ellipticity of 1.88, an optical grating having an initial width of approximately 30 um or so may better match the mode profile of the laser. Alternatively, other initial widths may better match other mode profiles.

With further reference to the transceiver system 600 of FIG. 6, in some embodiments a distance 612 from the output 606 of the laser 604 to a front surface 603 of the optical grating 602 may equal approximately 30 um. Alternately, the distance 612 may be greater than 30 um. Additionally, the length of the optical grating 602 may be lengthened. In some embodiments, the distance 612 may be less than 30 um. Additionally, the length of the optical grating 602 may be shortened.

In some embodiments, the optical grating 602 is an apodizing optical grating. For example, the optical grating 602 may include a variable apodizing filter. In some configurations, the optical grating 602 may vary from the front surface 603 of the optical grating to a back of the optical grating. For example, the optical grating may vary such that a relatively lower portion of light is redirected toward the front of the optical grating 602 where the light may be relatively more intense and a relatively higher portion of light is redirected toward the back of the optical grating 602 where the light may be relatively less intense.

In some embodiments, a fan angle 614 may be approximately 39 degrees, such as when the initial width 610 is 20.0 um. Alternately, the fan angle 614 may be approximately 60 degrees, such as when the initial width 610 is 30 um. Alternately, the fan angle 614 may be another angle, such as an angle greater than 28 degrees, such as an angle greater than approximately 39 degrees and less than approximately 60 degrees. Alternately, the fan angle 614 may be approximately 37 degrees to 41 degrees, such as when the initial width 610 of the optical grating 602 is approximately 19 um to 21 um. Alternately, the fan angle 614 may be approximately 35 degrees to 43 degrees, 33 degrees to 45 degrees, or 31 degrees to 47 degrees, such as when the initial width 610 of the optical grating 602 is approximately 18 um to 22 um, 17 um to 23 um, or 16 um to 24 um, respectively.

Figure 8:
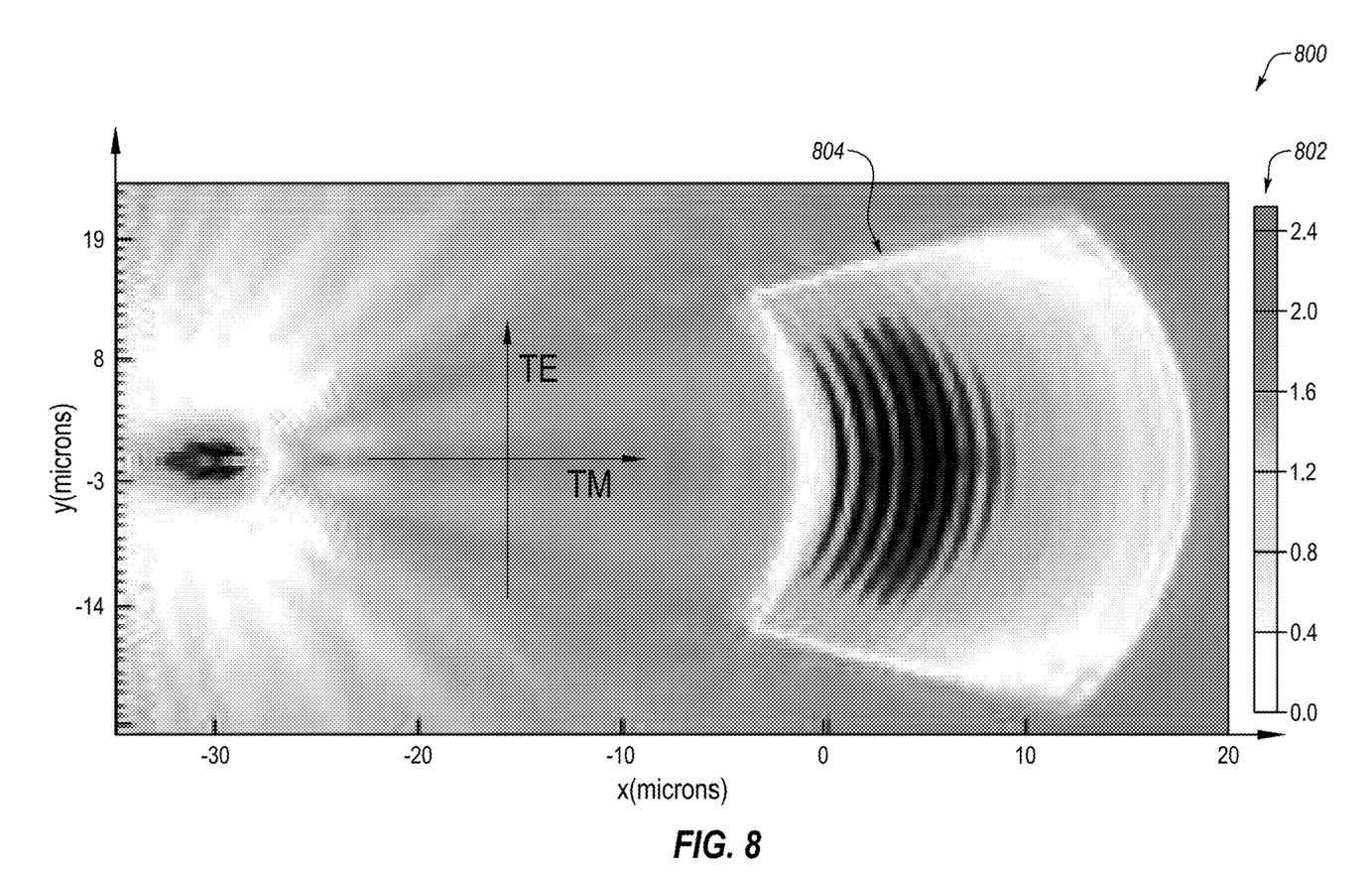
FIG. 8 illustrates an example near field mode profile of an optical intensity at the transceiver system of FIG. 6.

FIG. 8 illustrates an example near field mode profile 800 of an optical intensity at the transceiver system 600 of FIG. 6 when the initial width 610 of the optical grating 602 is approximately 30 um for a laser beam having a 1310 nm wavelength. The profile 800 includes a scale 802 of the optical intensity values in a.u.

As indicated in FIG. 8, the y-axis may be associated with the TE direction. The x-axis may be associated with the TM direction. The profile 800 is arranged such that the laser 604 and the output 606 of FIG. 6 are located approximately on the x-axis (e.g., y=0 um) and the center of the front 603 of the optical grating 602 of FIG. 6 is located on the y-axis (e.g., x=0 um). Thus, for example, the output 606 may be located at approximately (−30, 0). The optical intensity objects shown near this point (e.g., the left portion of the profile 800) may generally be associated with optical intensities produced by and/or reflected toward the laser 604 of FIG. 6.

A center of the front surface 603 of the optical grating 602 may be located at approximately (0, 0) of the profile 800. The optical intensities observed at the optical grating 602 may be located at the positive-x portion of the profile 800 (e.g., the right portion of the profile 800). An analysis of a mode profile 804 of the optical grating shows that the mode profile 804 has an Wx of approximately 5 um and an Wy of approximately 10 um. Thus, for example, the mode profile 304 of the optical grating 202 may be observed as being elliptical such that the mode profile 304 is relatively elongated in the TE direction. For this and other embodiments, the ellipticity of the optical intensities observed at the optical gratings may be defined as Wx/Wy. Thus, for example, the ellipticity of the optical grating 602 is approximately 0.5.

Figure 9:
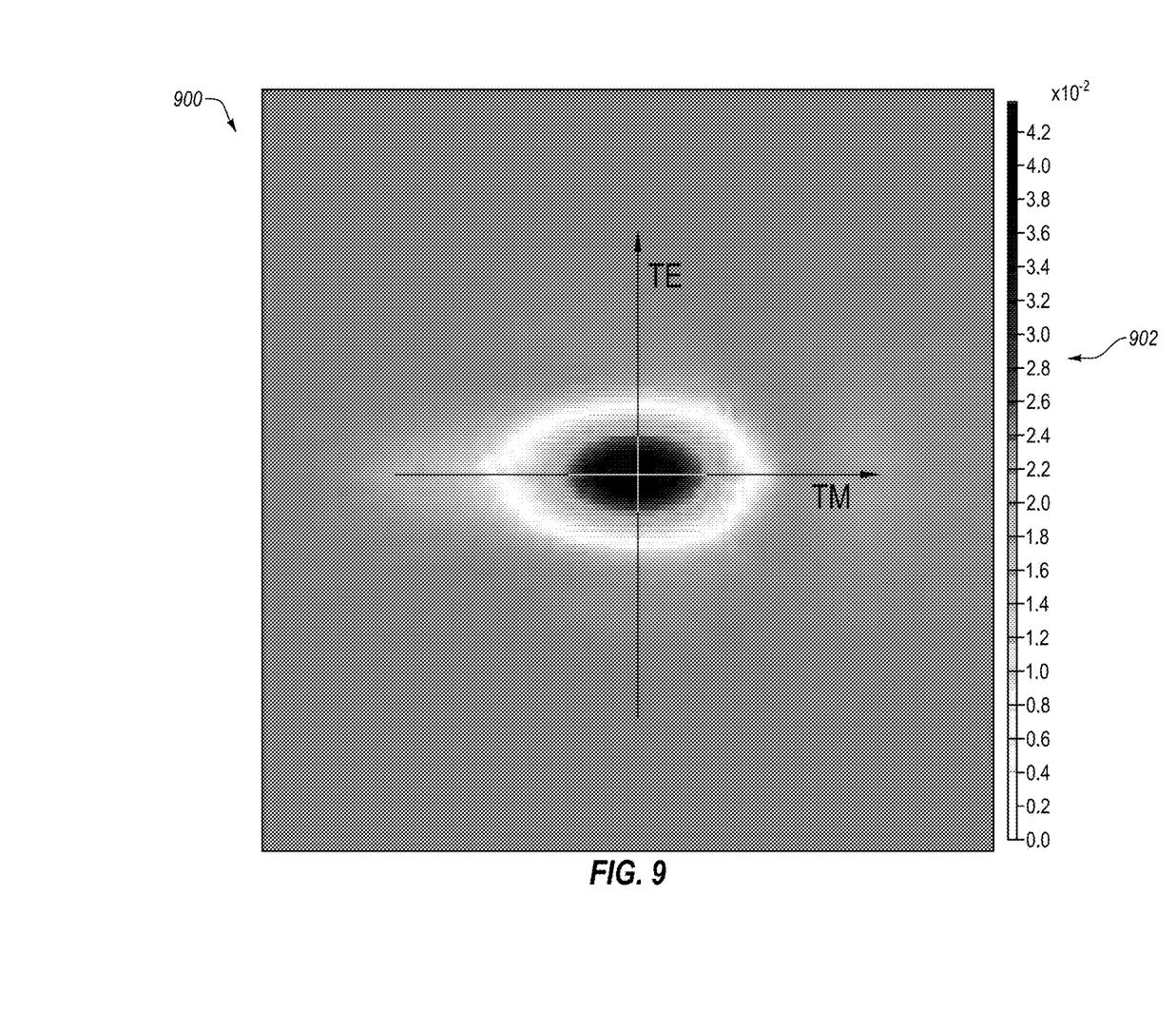
FIG. 9 illustrates a far field mode profile that may result from the transceiver system of FIG. 6.

FIG. 9 illustrates a far field mode profile 900 that may result from the optical grating 602 of FIG. 6 and the profile 800 of FIG. 8. The profile 900 includes a scale 902 of optical intensities in a.u. As may be observed, the far field mode profile 900 has an elliptical shape. The profile 900 may be relatively elongated in the TM direction.

Figure 10:
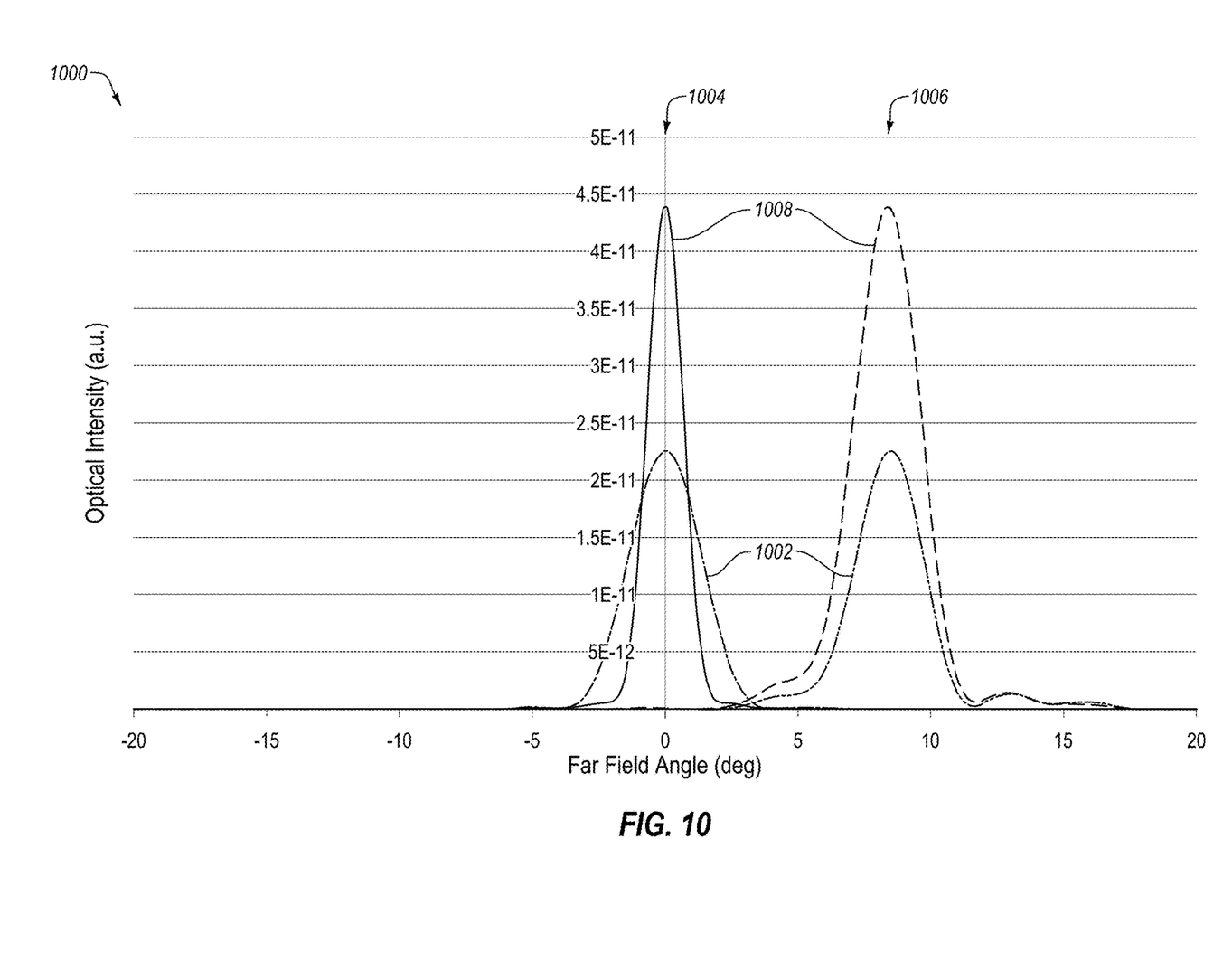
FIG. 10 illustrates an example far field profile comparison.

FIG. 10 illustrates an example far field profile comparison 1000 for TE direction 1004 and TM direction 1006 cut-view through the peak for a 1310 nanometer wavelength laser beam and a 1.45 refractive index for an optical grating cladding layer. For example, the comparison may be of the far field mode profile 400 of FIG. 4 and the far field mode profile 900 of FIG. 9 resulting from the optical grating 202 of FIG. 2 having an initial width 210 of 14.48 um and the optical grating 602 of FIG. 6 having an initial width 610 of 30 um, respectively.

For the 14.48 um optical grating, far field intensities 1002 in the TE direction 1004 and the TM direction 1006 may be symmetric. Thus, for example, the TE and TM divergence angles may be symmetric for the 14.48 um optical grating far field intensities 1002. For the far field intensities 1008 of the 30 um optical grating, the divergence angle in the TM direction 1006 may be larger than the divergence angle in the TE direction 1004, which may more closely fit the mode profile of the laser beam.

Figure 11:
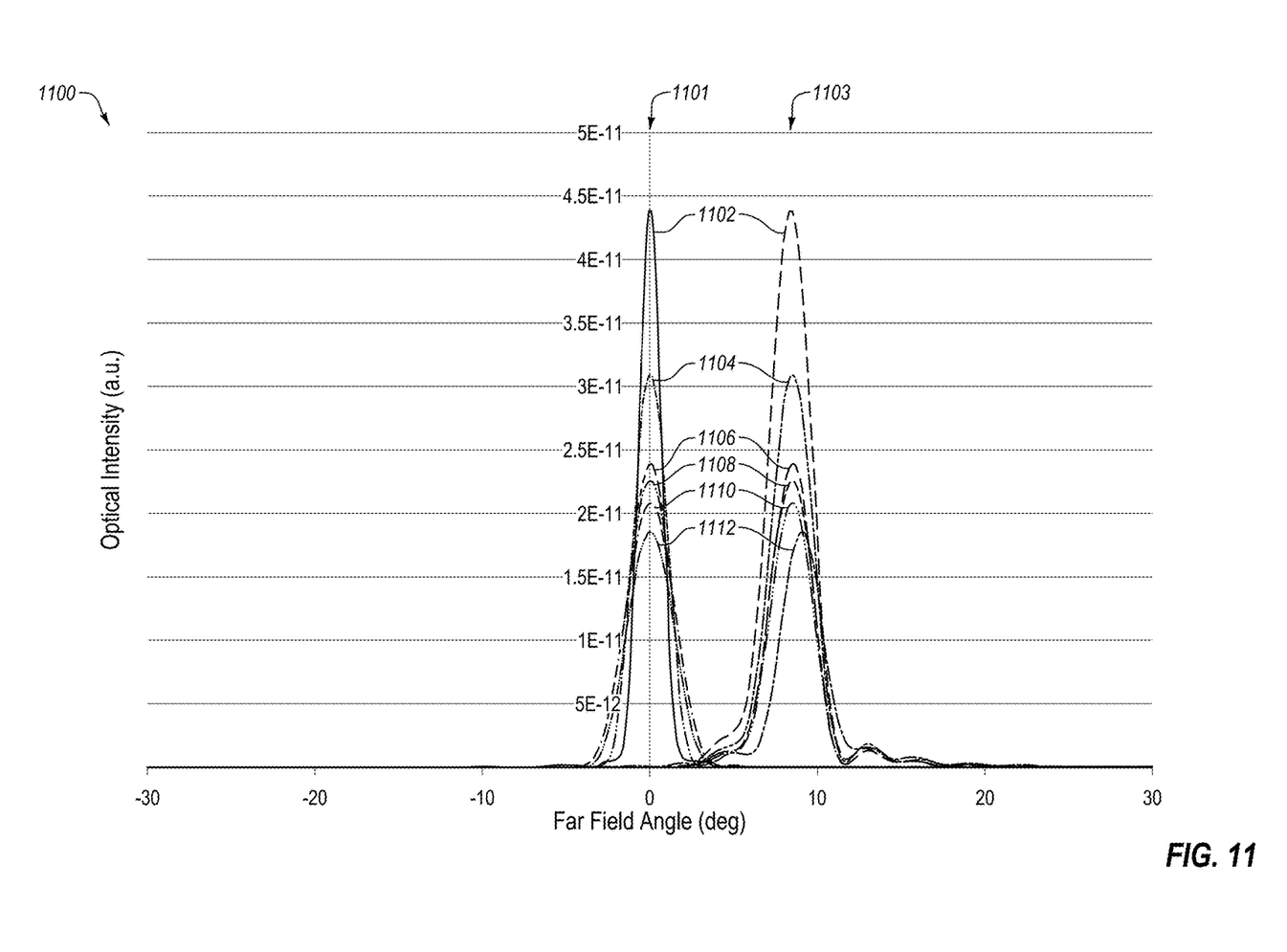
FIG. 11 illustrates another example far field profile comparison.

FIG. 11 illustrates an example far field profile comparison 1100 for TE direction 1101 and TM direction 1103 cut-view through the peak for a 1310 nanometer wavelength laser beam and a 1.45 refractive index for the optical grating cladding layer. A far field intensity 1102 may be associated with an apodized optical grating having an initial width of 30 um and located 30 um from a laser origin. The far field intensity 1102 may generally correspond to the far field intensity 1008 of FIG. 10. A far field intensity 1104 may be associated with an apodized optical grating having an initial width of 20.0 um and located 30 um from a laser origin. A far field intensity 1106 may be associated with an apodized optical grating having an initial width of 14.48 um and located 20.0 um from a laser origin. A far field intensity 1108 may be associated with an apodized optical grating having an initial width of 14.48 um and located 30 um from a laser origin. The far field intensity 1108 may generally correspond to the far field intensity 1002 of FIG. 10. A far field intensity 1110 may be associated with an apodized optical grating having an initial width of 14.48 um and located 40 um from a laser origin. A far field intensity 1112 may be associated with a uniform optical grating having an initial width of 14.48 um and located 20.0 um from a laser origin.

Figure 12:
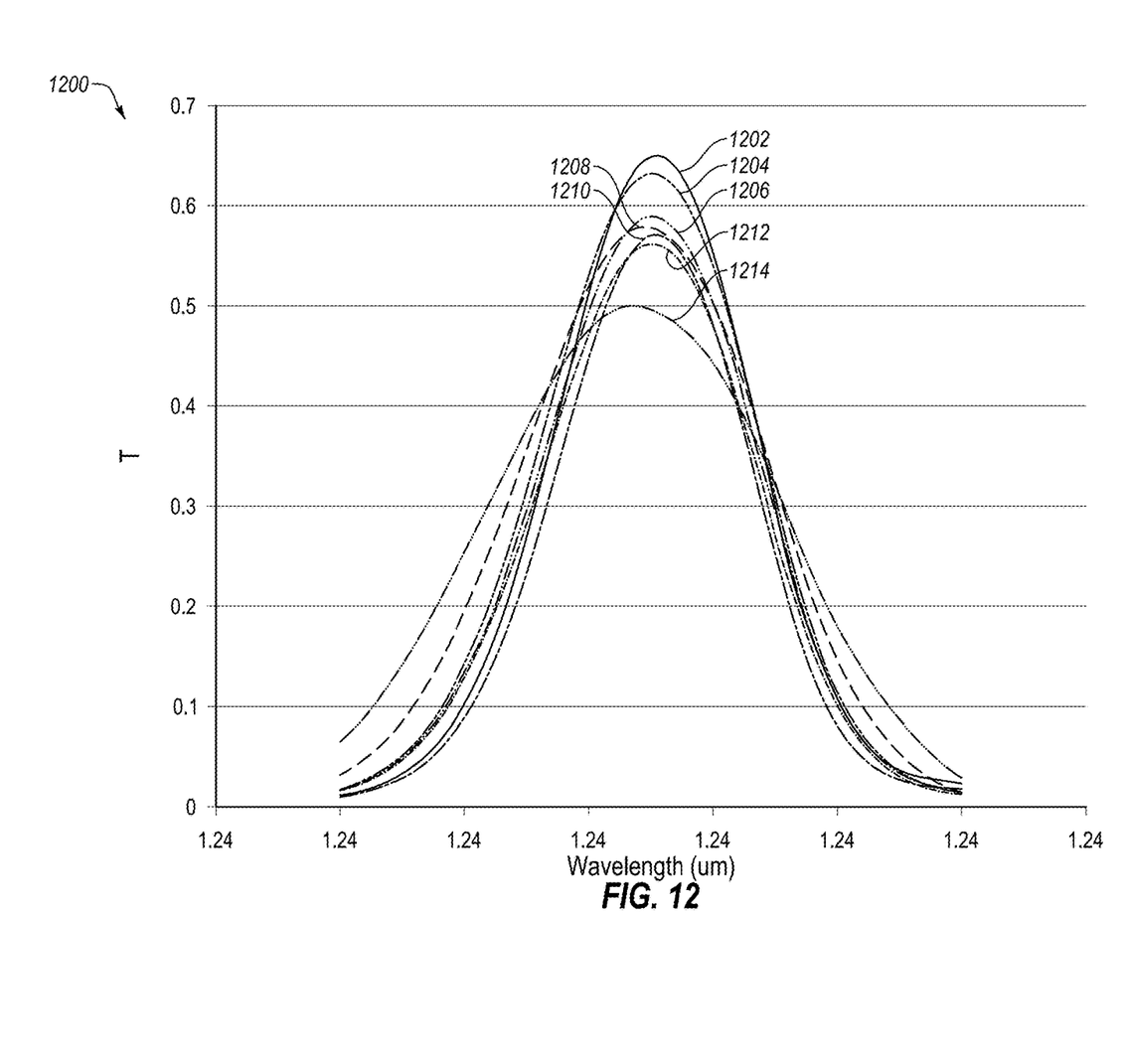
FIG. 12 is a graph comparing coupling efficiencies.
Figure 13:
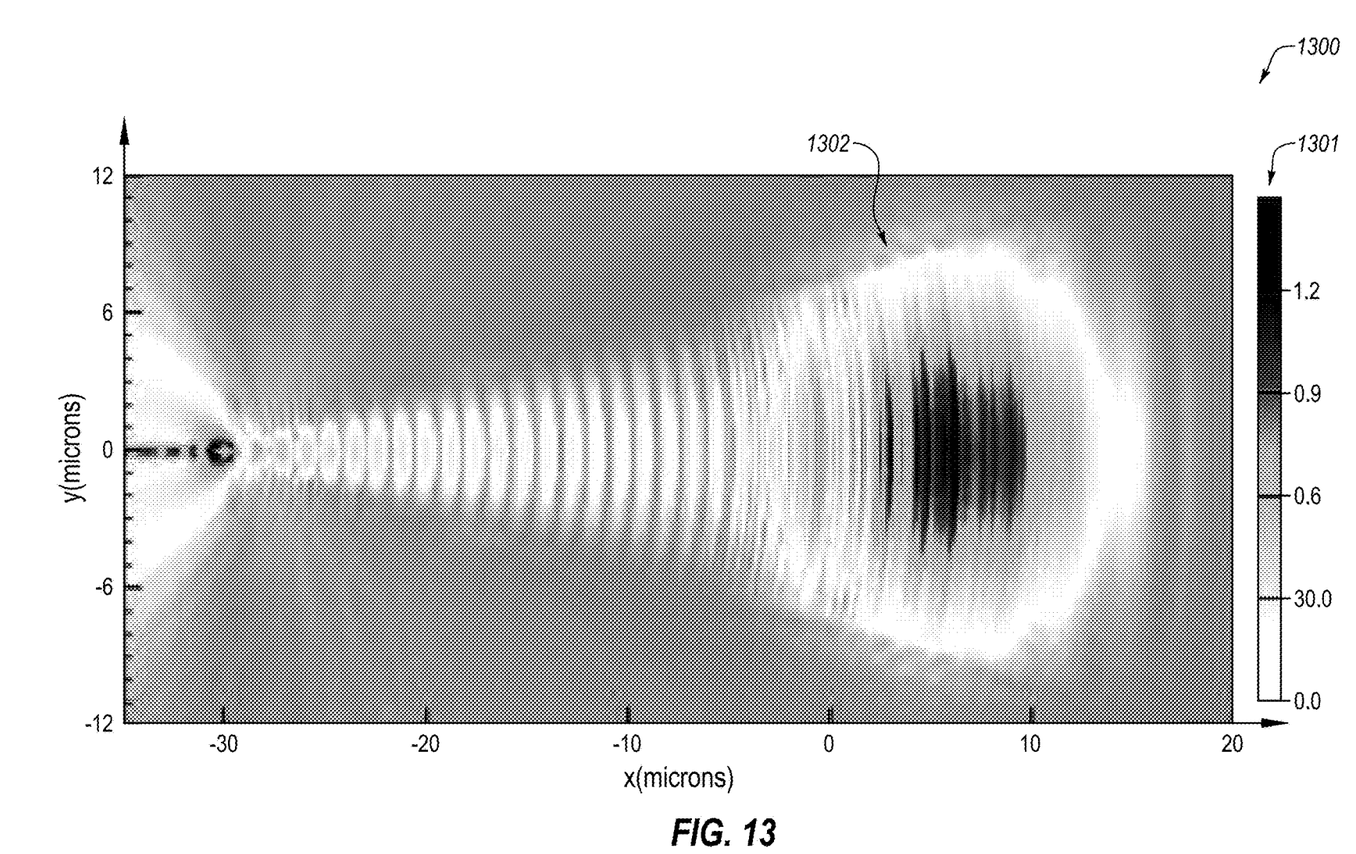
FIG. 13 illustrates an example near field mode profile of an optical intensity at an example transceiver system.
Figure 14:
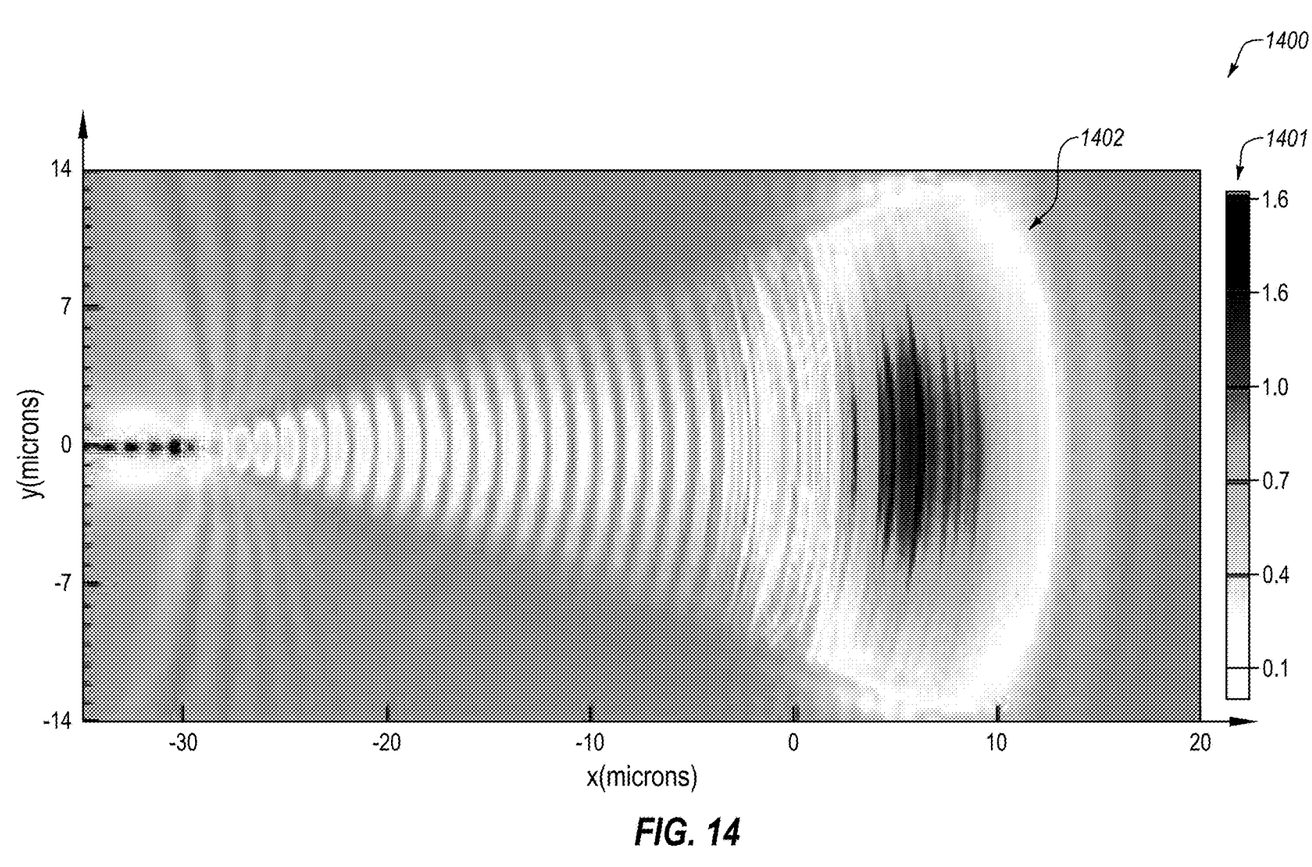
FIG. 14 illustrates an example near field mode profile of an optical intensity at another example transceiver system.
Figure 15:
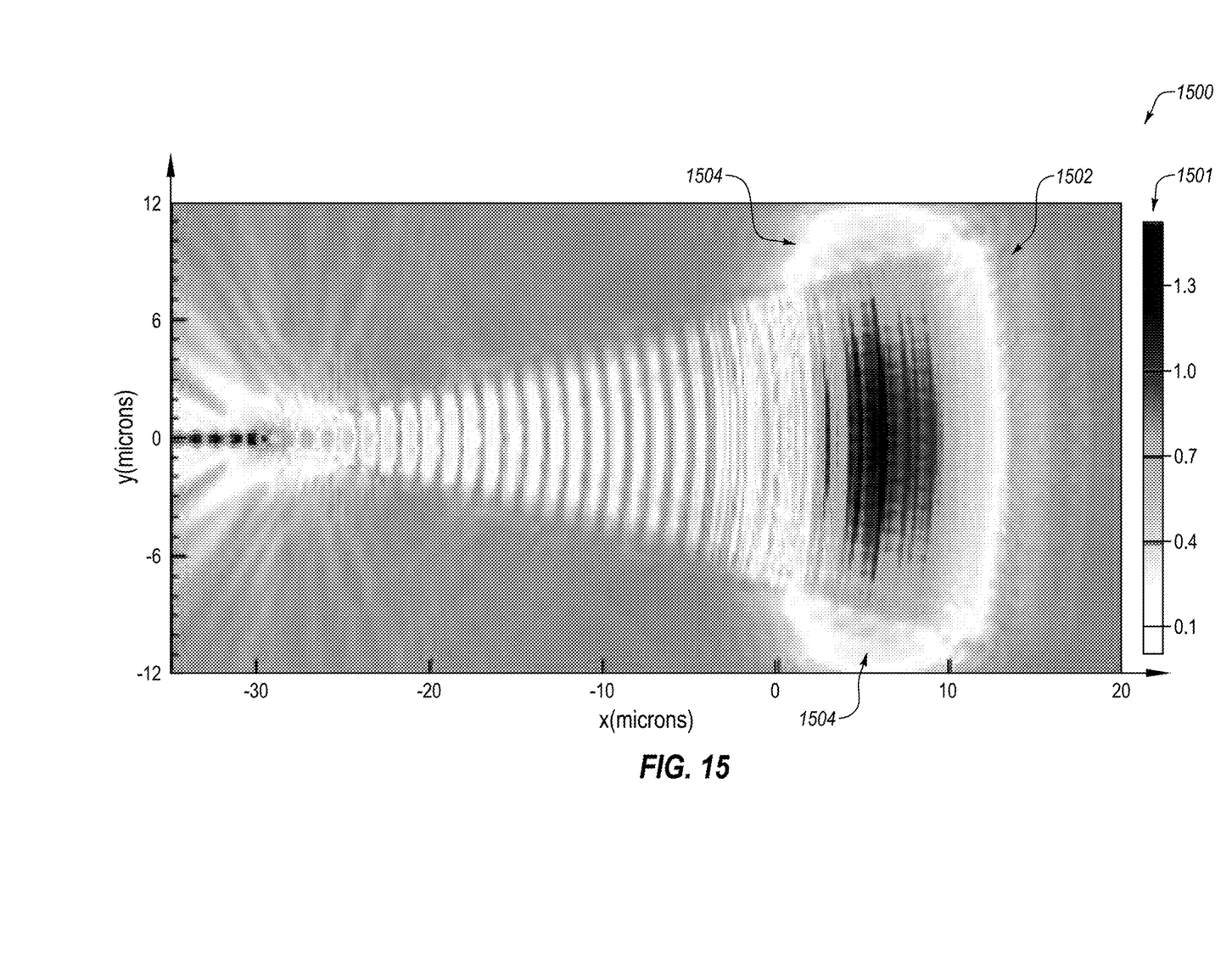
FIG. 15 illustrates an example near field mode profile of an optical intensity at still another example transceiver system.

FIG. 12 is a graph comparing coupling efficiency for a Gaussian beam having various mode profile shapes and sizes coupled to optical gratings having various widths. The graph includes a coupling efficiency (T) to wavelength curve in um for a variety of configurations. A coupling efficiency 1202 may be associated with a beam having a mode profile including a Wx of 6 um and a Wy of 6 um from an optical grating having an initial width of 14.48 um. The coupling efficiency 1202 may be associated with a beam represented by the mode profile 304 of FIG. 3. Alternately or additionally, the coupling efficiency 1202 may be associated with a beam having a mode profile 1302 as illustrated in FIG. 13. A coupling efficiency 1204 may be associated with a beam having a mode profile including a Wx of 5 um and a Wy of 10 um from an optical grating having an initial width of 20.0 um. The coupling efficiency 1204 may be associated with a beam that may be generated by the transceiver system 600 of FIG. 6 when the initial width 610 is 20.0 um. For example, the coupling efficiency 1204 may be associated with a beam having a mode profile 1402 as illustrated in FIG. 14. A coupling efficiency 1206 may be associated with a beam having a mode profile including a Wx of 5 um and a Wy of 10 um from an optical grating having an initial width of 14.48 um. The coupling efficiency 1206 may be associated with a beam having a mode profile 1502 as illustrated in FIG. 15.

Figure 16:
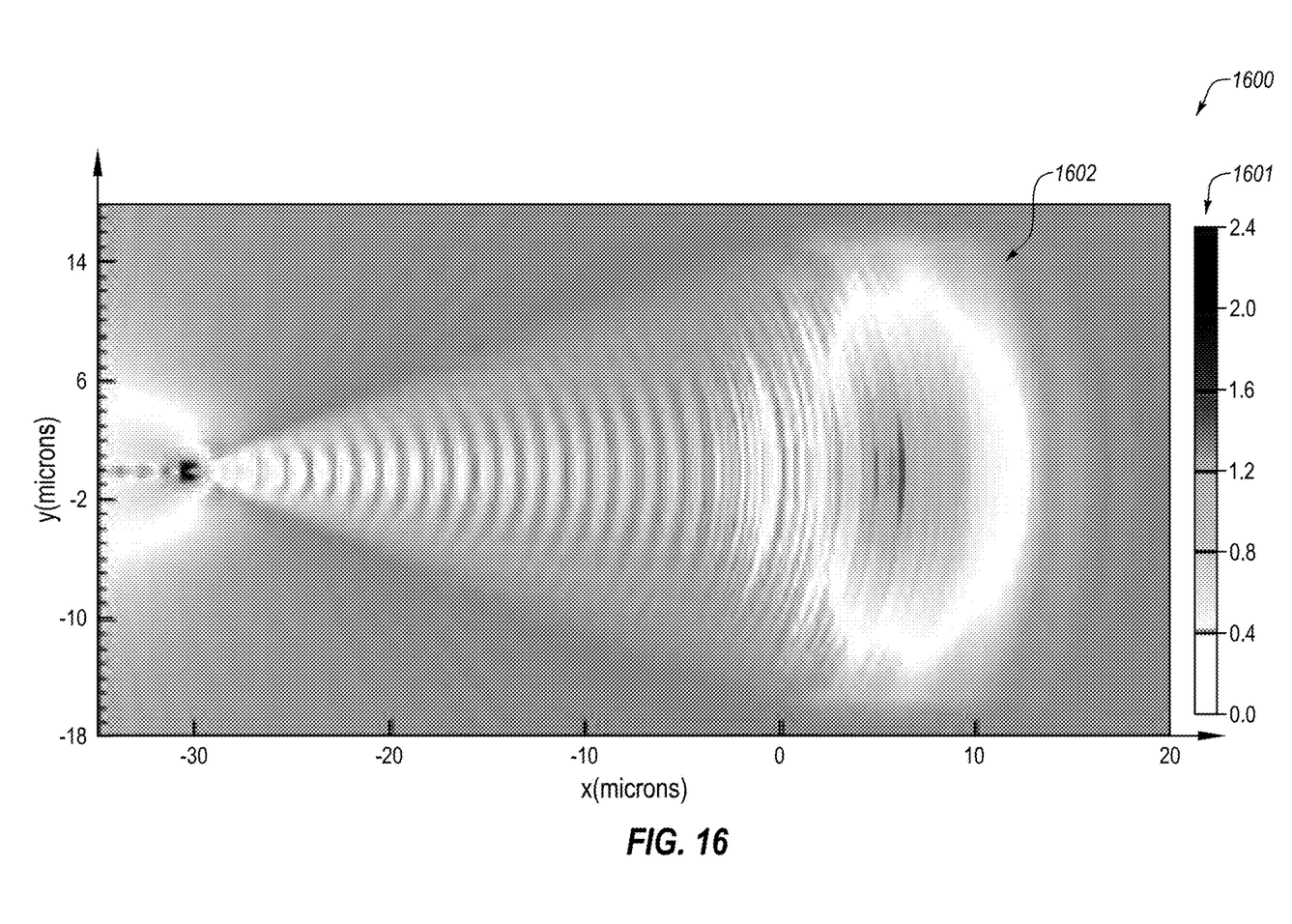
FIG. 16 illustrates an example near field mode profile of an optical intensity at yet another example transceiver system.

A coupling efficiency 1208 may be associated with a beam having a mode profile including a Wx of 4 um and a Wy of 8 um from an optical grating having an initial width of 14.48 um. A coupling efficiency 1210 may be associated with a beam having a mode profile including a Wx of 6 um and a Wy of 12 um from an optical grating having an initial width of 14.48 um. A coupling efficiency 1212 may be associated with a beam having a mode profile including a Wx of 5 um and a Wy of 10 um from an optical grating having an initial width of 30 um. The coupling efficiency 1212 may be associated with a beam having a mode profile 1602 as illustrated in FIG. 16. A coupling efficiency 1214 may be associated with a beam having a mode profile including a Wx of 3 um and a Wy of 6 um from an optical grating having an initial width of 14.48 um.

Furthermore, the following table is an example summary of peak coupling losses for the various configurations in the coupling efficiency graph 1200 of FIG. 12.

TABLE 1

| | Wx (um) | Wy (um) | e (Wx/Wy) | Y (um) | Loss (dB) |
|---|---|---|---|---|---|
| Conventional grating, circular mode | 6 | 6 | 1 | 14.48 | −1.87 |
| Conventional grating, 3 × 6 elliptical mode | 3 | 6 | 0.5 | 14.48 | −3.01 |
| Conventional grating, 4 × 8 elliptical mode | 4 | 8 | 0.5 | 14.48 | −2.38 |
| Conventional grating, 5 × 10 elliptical mode | 5 | 10 | 0.5 | 14.48 | −2.30 |
| Conventional grating, 6 × 12 elliptical mode | 6 | 12 | 0.5 | 14.48 | −2.44 |
| 20 micrometer grating, 5 × 10 elliptical mode | 5 | 10 | 0.5 | 20 | −2.00 |
| 30 micrometer grating, 5 × 10 elliptical mode | 5 | 10 | 0.5 | 30 | −2.52 |

The lowest loss in the above table occurs for a beam having a circular mode, where Wx=Wy=6 um with a conventional optical grating having an initial width of 14.48 um, which may correspond to the coupling efficiency 1202 of FIG. 12. The −1.87 dB loss may be used as a reference relative to cases having a laser mode exhibiting an ellipticity (Wx/Wy) of 0.5.

In some embodiments, a 5 um Wx, 10 um Wy laser mode may exhibit an additional 0.43 dB loss (−2.30 dB compared to −1.87 dB) relative to the circular mode reference with a 14.48 um optical grating. The 5 um Wx, 10 um Wy laser mode with the 14.48 um optical grating may be associated with the coupling efficiency 1206 of FIG. 12. The additional loss of the 5 um Wx, 10 um Wy laser mode may be reduced to a 0.13 dB loss (−2.00 dB compared to −1.87 dB) where the optical grating size is 20.0 um. The 5 um Wx, 10 um Wy with the 20.0 um optical grating may be associated with the coupling efficiency 1204 of FIG. 12.

In some embodiments, the size of the laser mode and/or the size of the optical grating may be altered from these numbers to further reduce the losses. For example, a 4.5 um Wx, 9.0 um Wy laser mode, a 5.5 um Wx, 11.0 um Wy laser mode, or some other size of laser mode may be employed. Alternately or additionally, approximately 17.0 um, 17.5 um, 18.0 um, 18.5 um, 19.0 um, 19.5 um, 20.5 um, 21.0 um, 21.5 um, 22.0 um, 22.5 um, or 23.0 um optical gratings, or some other size of optical grating may be employed.

FIG. 13 illustrates an example near field mode profile 1300 of an optical intensity at an example transceiver system. The profile 1300 includes a scale 1301 of the optical intensity values in a.u. A mode profile 1302 of an optical grating having an initial width of 14.48 um may include a Wx of approximately 6 um and a Wy of approximately 6 um. The ellipticity of the mode profile 1302 may be 1.

FIG. 14 illustrates an example near field mode profile 1400 of an optical intensity at an example transceiver system. The profile 1400 includes a scale 1401 of the optical intensity values in a.u. A mode profile 1402 of an optical grating having an initial width of 20.0 um may include a Wx of approximately 5 um and a Wy of approximately 10 um. The ellipticity of the mode profile 1302 may be 0.5.

FIG. 15 illustrates an example near field mode profile 1500 of an optical intensity at an example transceiver system. The profile 1500 includes a scale 1501 of the optical intensity values in a.u. A mode profile 1502 of an optical grating having an initial width of 14.48 um may include a Wx of approximately 5 um and a Wy of approximately 10 um. The ellipticity of the mode profile 1502 may be 0.5. A portion of the mode 1504 may fall out of the optical grating edge.

FIG. 16 illustrates an example near field mode profile 1600 of an optical intensity at an example transceiver system. The profile 1600 includes a scale 1601 of the optical intensity values in a.u. A mode profile 1602 of an optical grating having an initial width of 30 um may include a Wx of approximately 5 um and a Wy of approximately 10 um. The ellipticity of the mode profile 1502 may be 0.5.

What is claimed is:

1. A transceiver system comprising:
   a laser configured to emit a laser beam at an output of the laser, the laser beam having a non-circular elliptical mode profile; and
   a curved optical grating configured to exhibit a mode profile having a shape corresponding to the non-circular elliptical mode profile of the laser beam, the curved optical grating including a front surface having a width equal to or greater than 15 micrometers and a fan angle equal to or greater than 45 degrees, the front surface located a distance greater than 30 micrometers from the output of the laser.

2. The transceiver system of claim 1, the width of the front surface of the curved optical grating further being less than 35 micrometers.

3. The transceiver system of claim 1, the width of the front surface of the curved optical grating further being greater than 16 micrometers and less than 32 micrometers.

4. The transceiver system of claim 1, the width of the front surface of the curved optical grating further being greater than 18 micrometers and less than 30 micrometers.

5. The transceiver system of claim 1, the width of the front surface of the curved optical grating further being equal to or greater than 20 micrometers and equal to or less than 30 micrometers.

6. The transceiver system of claim 1, the width of the front surface of the curved optical grating further being greater than 19 micrometers and less than 21 micrometers.

7. The transceiver system of claim 1, the width of the front surface of the curved optical grating further being greater than 29 micrometers and less than 31 micrometers.

8. The transceiver system of claim 1, wherein the curved optical grating exhibits a mode profile having a larger divergence angle in a transverse magnetic (TM) direction relative to a transverse electric (TE) direction.

9. The transceiver system of claim 1, wherein the curved optical grating exhibits a mode profile having a radius in a transverse electric (TE) direction that is approximately twice as long as a radius in a transverse magnetic (TM) direction.

10. A transceiver system comprising:
 a laser configured to emit a laser beam at an output of the laser, the laser beam having a non-circular elliptical mode profile having a radius in a transverse electric (TE) direction that is approximately twice as long as a radius in a transverse magnetic (TM) direction; and
 a curved silicon grating including a front surface having a radius of 30 micrometers, a width greater than 15 micrometers, and a fan angle greater than 45 degrees, the front surface located a distance of 30 micrometers from the output of the laser, the curved silicon grating configured to exhibit a mode profile having a radius in the TE direction that is approximately twice as long as a radius in the TM direction.

11. The transceiver system of claim 10, the width of the front surface of the curved silicon grating further being less than 35 micrometers.

12. The transceiver system of claim 10, the width of the front surface of the curved silicon grating further being greater than 16 micrometers and less than 32 micrometers.

13. The transceiver system of claim 10, the width of the front surface of the curved silicon grating further being greater than 18 micrometers and less than 30 micrometers.

14. The transceiver system of claim 10, the width of the front surface of the curved silicon grating further being equal to or greater than 20 micrometers and equal to or less than 30 micrometers.

15. The transceiver system of claim 10, the width of the front surface of the curved silicon grating further being greater than 19 micrometers and less than 21 micrometers.

16. The transceiver system of claim 10, the width of the front surface of the curved silicon grating further being greater than 29 micrometers and less than 31 micrometers.

17. A transceiver system comprising:
 a laser configured to emit a laser beam at an output of the laser, the laser beam having a non-circular elliptical mode profile having a radius in a transverse electric (TE) direction that is approximately twice as long as a radius in a transverse magnetic (TM) direction; and
 a curved silicon grating including a front surface having a radius of 30 micrometers, a width greater than or equal to 18 micrometers and less than or equal to 22 micrometers, and a fan angle greater than 55 degrees, the front surface located a distance of 30 micrometers from the output of the laser, the curved silicon grating configured to exhibit a mode profile having a radius in the TE direction that is approximately twice as long as a radius in the TM direction.

18. The transceiver system of claim 17, wherein the width of the front surface is greater than or equal to 19 micrometers and less than 21 micrometers.

\* \* \* \* \*